US011196420B1

(12) United States Patent
Das et al.

(10) Patent No.: US 11,196,420 B1
(45) Date of Patent: Dec. 7, 2021

(54) LEVEL SHIFTER

(71) Applicant: SAMSUNG ELECTRONICS CO., LTD., Suwon-si (KR)

(72) Inventors: Tamal Das, Kalyani (IN); Ankur Ghosh, Kolkata (IN)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 17/026,487

(22) Filed: Sep. 21, 2020

(30) Foreign Application Priority Data

Jul. 15, 2020 (IN) .............................. 202041030189

(51) Int. Cl.
*H03K 19/0185* (2006.01)
*H03K 3/356* (2006.01)
(52) U.S. Cl.
CPC . *H03K 19/018528* (2013.01); *H03K 3/35613* (2013.01)
(58) Field of Classification Search
CPC ....... H03K 3/35613; H03K 19/018507; H03K 19/018514; H03K 19/018521; H03K 19/018528
USPC ..................................... 326/80, 81; 327/333
See application file for complete search history.

(56) References Cited

U.S. PATENT DOCUMENTS

| | | | |
|---|---|---|---|
| 7,180,329 B1 | 2/2007 | Sia et al. | |
| 7,554,360 B1 | 6/2009 | Jiang | |
| 8,736,346 B2 * | 5/2014 | Shimizu | 327/333 |
| 9,800,246 B2 * | 10/2017 | Roham | H03K 3/35613 |
| 9,838,015 B2 * | 12/2017 | Kung | H03K 3/356182 |
| 2004/0000929 A1 * | 1/2004 | Aoki | H03K 3/012 326/68 |
| 2005/0007176 A1 * | 1/2005 | Seki | H03K 3/356113 327/333 |
| 2005/0206635 A1 * | 9/2005 | Hashimoto | G09G 3/3688 345/204 |
| 2006/0290404 A1 * | 12/2006 | Law | H03K 3/012 327/333 |

(Continued)

OTHER PUBLICATIONS

Seyed Rasool Hosseini et al., "A High-Speed and Power-Efficient Voltage Level Shifter for Dual-Supply Applications", IEEE Transactions on Very Large Scale Integration (VLSI) Systems, vol. 25, Issue 3, DOI: 10.1109/TVLSI.2016.2604377, Sep. 21, 2016, 6 pages total (p. 1154-8).

*Primary Examiner* — William Hernandez
(74) *Attorney, Agent, or Firm* — Sughrue Mion, PLLC

(57) ABSTRACT

A level shifter includes main and auxiliary level shifters, a switch circuit and a hold circuit. The main level shifter includes NMOS and PMOS transistors in a Differential to Single Ended (D2S) structure. The auxiliary level shifter is connected to an output of the main level shifter and includes NMOS and PMOS transistors. Each of the main and auxiliary level shifters includes internal nodes. The switch circuit settles first nodes of the internal nodes to values to support high speed data transmission, and the hold circuit holds second nodes of the internal nodes to a certain value during low frequency operation. The level shifter receives a serial stream of binary values of core supply voltage, converts the serial stream of binary values from the core supply voltage to an input/output (I/O) voltage, and outputs the serial stream of binary values of the input/output (I/O) voltage.

18 Claims, 7 Drawing Sheets

(56) References Cited

U.S. PATENT DOCUMENTS

| | | | |
|---|---|---|---|
| 2007/0262790 A1* | 11/2007 | Cheon | H03K 19/018528 326/81 |
| 2008/0164931 A1* | 7/2008 | Kimura | H03K 19/018528 327/333 |
| 2009/0066399 A1* | 3/2009 | Chen | H03K 3/35613 327/333 |
| 2012/0038611 A1* | 2/2012 | Otani | H03K 3/356165 345/211 |
| 2012/0056614 A1* | 3/2012 | Yeh | H03M 1/361 324/140 R |
| 2012/0075001 A1* | 3/2012 | Sumitomo | H03K 3/356165 327/333 |
| 2014/0108826 A1* | 4/2014 | Yu | H03K 19/0185 713/300 |

* cited by examiner

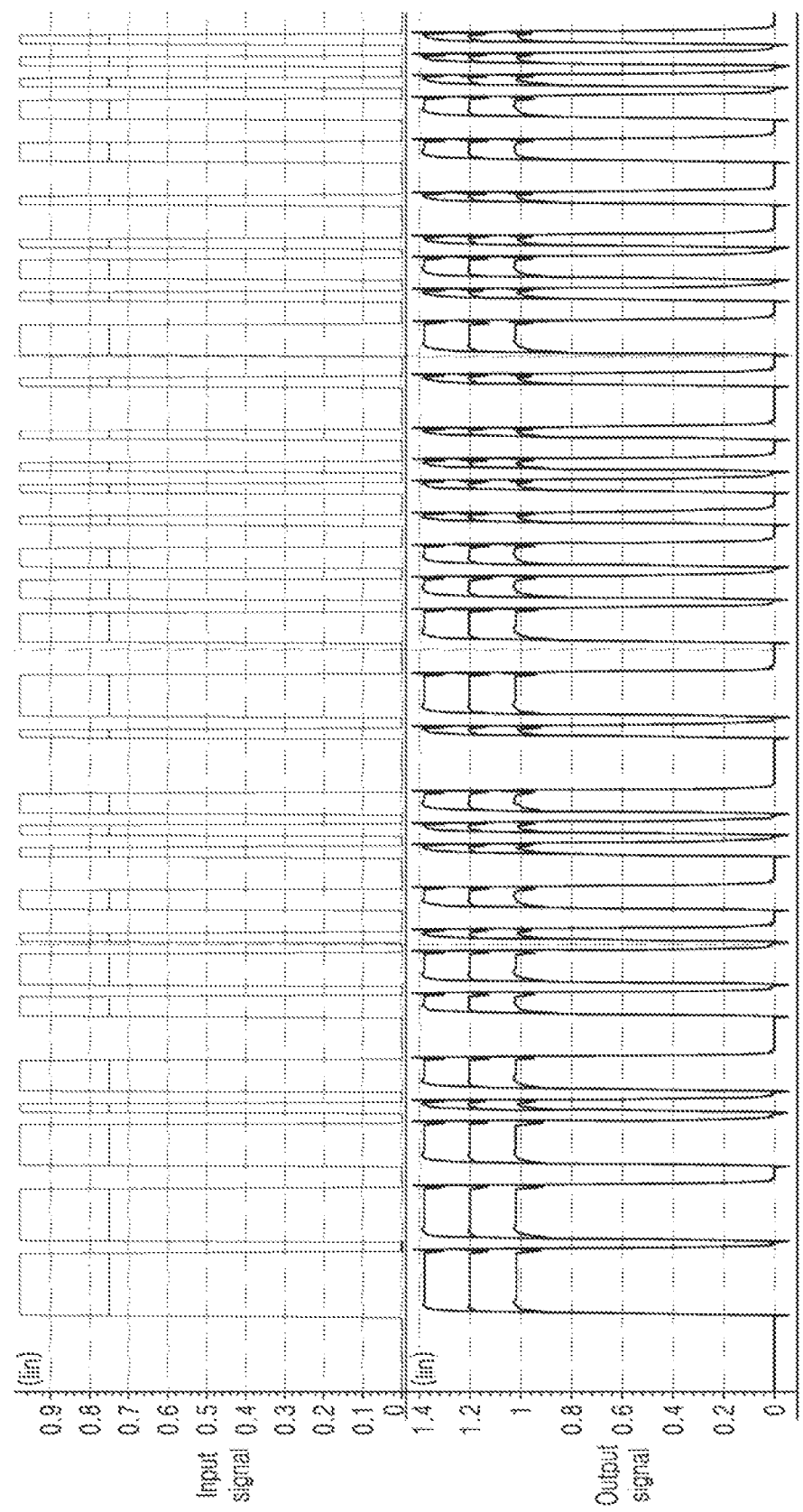

LEVEL SHIFTER

CROSS-REFERENCE TO RELATED APPLICATION

This application claims priority from Indian Patent Application No. 202041030189, filed on Jul. 15, 2020 in the Indian Intellectual Property Office, the disclosure of which is incorporated by reference herein in its entirety.

BACKGROUND

1. Field

The present disclosure relates to digital communication systems, and more specifically to a level shifter for supporting a high speed data transmission.

2. Description of Related Art

A market demand for high speed data transmission increases for electronic devices like High Definition (HD) Television, HD monitors, HD projectors, routers, printers etc. A speed of the transmission of data mainly depends on a bandwidth of inter chip communication in the electronic devices and a power used for the transmission. There is a tension however between high speed transmission and power used for the transmission, in that it is advantageous to use lower power in electronic devices but lower power tends to decrease the speed of transmission.

A level shifter may be provided to match a voltage domain between various components in an electronic device that communicate via serial communications.

Many related art methods and circuit arrangements, such as that of a level shifter, have been proposed for supporting high speed data transmission, but these related art circuit arrangements may have disadvantages in terms of power consumption, robustness, reliability, integrity issues, operation dependency, time, cost, complexity, design, leakage current, hardware components used, size, converting the static data or Direct Current (DC) data while transmitting the data at the high speed or the like. Further, the related art level shifters add more jitter in the output signal and distort the output signal. Thus, it is advantageous to address the above mentioned shortcomings or at least provide a useful alternative.

SUMMARY

It is an aspect to provide a level shifter that supports high speed data transmission at a serial interface of an electronic device.

It is another aspect to provide the level shifter that reduces power consumption for high speed data transmission at the serial interface.

It is yet another aspect to support low frequency operation in the level shifter and to minimize power consumption at the level shifter during the low frequency operation.

It is yet another aspect to provide the level shifter in between a pre-driver and a driver of a serial data transmitter of the electronic device for matching a voltage domain of an output of the pre-driver to a voltage domain of an input of the driver.

It is yet another aspect to reduce an Inter Symbol Interference (ISI) and Data Dependent Jitter (DDJ) that occurs at the level shifter during high speed serial data transmission.

It is yet another aspect to convert a signal passing through a signal path of the serial data transmitter from a low voltage domain to a high voltage domain reliably without distorting the signal and without adding any the DDJ.

According to an aspect of an embodiment, there is provided a level shifter comprising a main level shifter portion comprising a plurality of first PMOS transistors and a plurality of first NMOS transistors; and an auxiliary level shifter portion that is connected to an output of the main level shifter portion, the auxiliary level shifter portion comprising a plurality of second PMOS transistors and a plurality of second NMOS transistors, wherein at least one of a first transistor of the plurality of first PMOS transistors of the main level shifter portion or a first transistor of the plurality of second PMOS transistors of the auxiliary level shifter portion is configured to support a low frequency operation of the level shifter.

According to an aspect of an embodiment, there is provided a level shifter comprising a current mirror level shifter comprising a plurality of NMOS transistors and a plurality of PMOS transistors; an auxiliary level shifter connected to the current mirror level shifter, the auxiliary level shifter comprising a plurality of NMOS transistors and a plurality of PMOS transistors, wherein the current mirror level shifter and the auxiliary level shifter include internal nodes; and a switch circuit that is configured to settle the internal nodes to predetermined values to support high speed data transmission.

According to an aspect of an embodiment, there is provided a level shifter comprising a main level shifter comprising a plurality of NMOS transistors and a plurality of PMOS transistors configured in a Differential to Single Ended (D2S) structure; an auxiliary level shifter connected to an output of the main level shifter, the auxiliary level shifter comprising a plurality of NMOS transistors and a plurality of PMOS transistors, wherein the main level shifter and the auxiliary level shifter include internal nodes; a switch circuit that is configured to settle first nodes of the internal nodes to predetermined values to support high speed data transmission; and a hold switch circuit that holds second nodes of the internal nodes to a certain value during low frequency operation, wherein the high speed data transmission is from 5 Giga bytes per second to 6 Giga bytes per second, the low frequency operation is less than or equal to 800 Mega bytes per second, and the level shifter receives a serial stream of binary values of core supply voltage of 0.6 v to 0.9 v, converts the serial stream of binary values from the core supply voltage to an input/output (I/O) voltage of 1.0 v to 1.4 v, and outputs the serial stream of binary values of the input/output (I/O) voltage.

BRIEF DESCRIPTION OF DRAWINGS

The above and other aspects will be more clearly understood from the following detailed description taken in conjunction with the accompanying drawings, in which:

FIG. 7 illustrates an input signal provided to the level shifter of FIG. 6A and an output signal generated by the level shifter of FIG. 6A based on the input signal, according to an embodiment.

DETAILED DESCRIPTION

Figure 1:
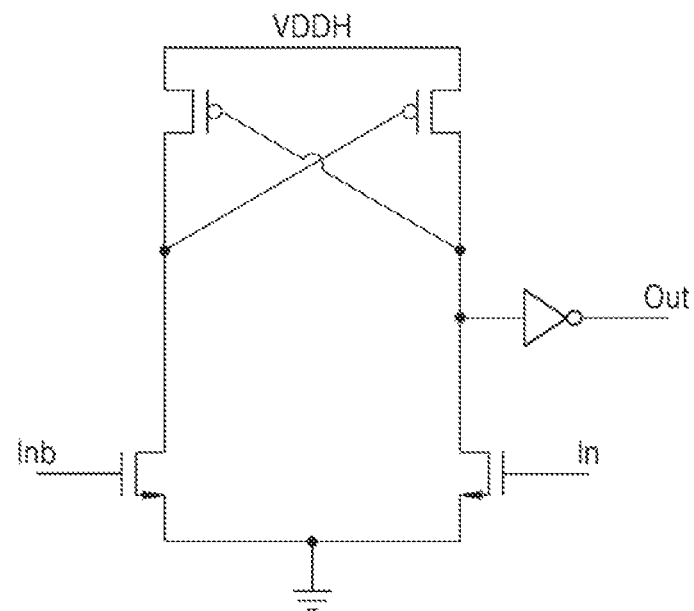
FIG. 1 illustrates a circuit arrangement of a latch based level shifter, according to the related art.

These above and other aspects of the embodiments herein will be better appreciated and understood when considered in conjunction with the following description and the accompanying drawings. It should be understood, however, that the following descriptions, while indicating various embodiments and numerous specific details thereof, are given by way of illustration and not of limitation. Many changes and modifications may be made within the scope of the embodiments herein without departing from the spirit thereof, and the embodiments herein include all such modifications.

Various embodiments herein and the various features and advantageous details thereof are explained more fully with reference to the non-limiting embodiments that are illustrated in the accompanying drawings and detailed in the following description. In the accompanying drawings, like reference designators indicate corresponding parts in the various drawings. Descriptions of well-known components and processing techniques are omitted so as to not unnecessarily obscure the embodiments herein. Also, the various embodiments described herein are not necessarily mutually exclusive, as some embodiments can be combined with one or more other embodiments to form new embodiments. The term "or" as used herein, refers to a non-exclusive or, unless otherwise indicated. The examples used herein are intended merely to facilitate an understanding of ways in which the embodiments herein may be practiced and to further enable those skilled in the art to practice the embodiments herein. Accordingly, the examples should not be construed as limiting the scope of the embodiments herein.

Typically, components inside a serial data transmitter of an electronic device include a serializer, a pre-driver and a driver. A method to achieve lower power consumption of the serial data transmitter includes providing a reduced supply voltage (i.e. core supply voltage) to the components of the serial data transmitter, which causes an amplitude of an output signal at the driver to be lowered. However, it is advantageous when the amplitude of the output signal at the driver is higher in order to generate a higher swing in the output signal. The higher swing in the output signal provides a better noise immunity at a transmission channel during data transmission. Further, the higher swing in the output signal is suitable for applications with optical extensions or legacy constraints. Therefore, the method of reducing the supply voltage to the driver is not advantageous. That is, providing a higher supply voltage to the components of the serial data transmitter in order to generate higher swing causes more power consumption.

In related art serial data transmitters, the serializer and some stages of the pre-driver operate using a reduced supply voltage and the driver operates using a higher supply voltage (i.e. input/output (I/O) voltage) to reduce power consumption. Further, a level shifter is connected in between the pre-driver and the driver for matching a voltage domain of an output of the pre-driver to a voltage domain of an input of the driver.

FIG. 1 illustrates a circuit arrangement of a latch based level shifter, according to the related art. A latch based level shifter is suitable for data transmission at a speed below 100 Megabytes per second. When operated at a speed above 100 Mbps, a contention occurs between a present input and a previous output state of the latch based level shifter and this contention becomes more problematic when the data transmits at a higher speed (e.g., at about 5 Gigabytes per second). Further, the latch based level shifter generates a zero static current (i.e. static data).

Figure 2:
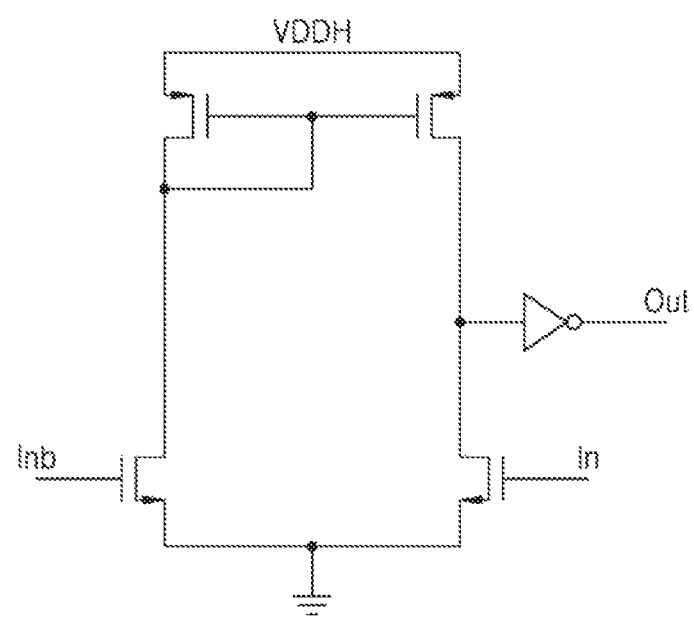
FIG. 2 illustrates a circuit arrangement of a current mirror based level shifter, according to the related art.

FIG. 2 illustrates a circuit arrangement of a current mirror based level shifter, according to the related art. A contention does not occur between a present input and a previous output state of the current mirror based level shifter when the data transmits at high speed (e.g., about 5 Gigabytes per second). However, the current mirror based level shifter has a disadvantage in that the current mirror based level shifter always draws a current for an input signal at a zero logic state. Further, the current mirror based level shifter has an additional disadvantage in that the current mirror based level shifter generates a high static current during static data transmission.

Figure 3A:
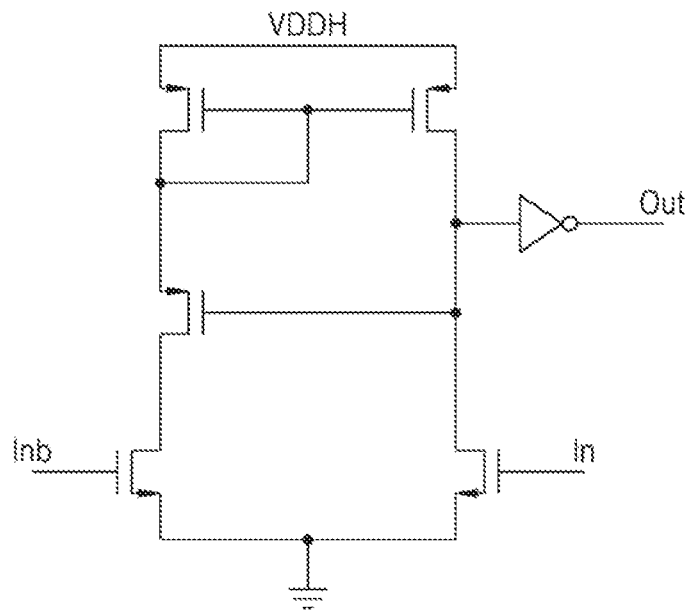
FIGS. 3A-3B illustrate a circuit arrangements of a Wilson current mirror based level shifters, according to the related art.
Figure 3B:
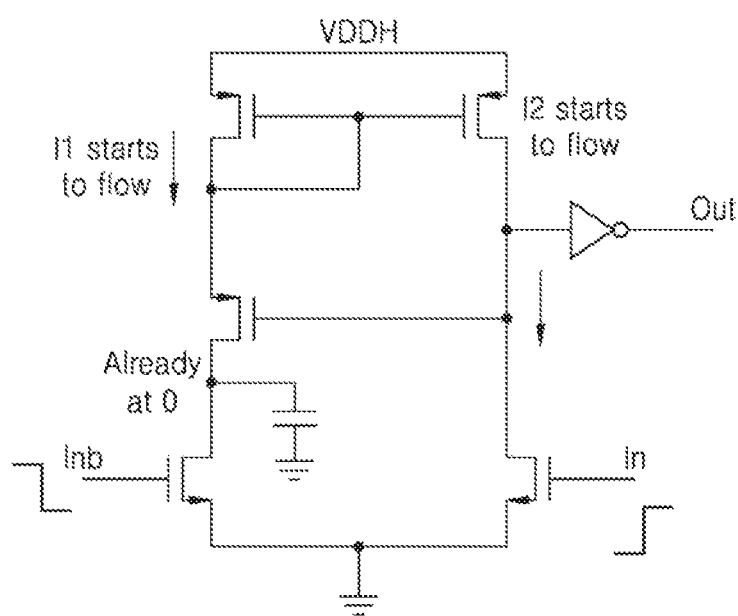

FIG. 3A-3B illustrate a circuit arrangement of a Wilson current mirror based level shifter, according to the related art. The Wilson current mirror based level shifter is suitable for data transmission at a speed over 100 Megabytes per second. However, the Wilson current mirror based level shifter has a disadvantage in that the contention still occurs between an input and output of the Wilson current mirror based level shifter during the high speed data transmission. Moreover, there are additional disadvantages in that the Wilson current mirror based level shifter draws the current while switching, and the Wilson current mirror based level shifter generates the zero static current during high speed data transmission. For example, a discharged capacitor connected to the Wilson current mirror based level shifter is shown in FIG. 3B. The current I1 and I2 starts to flow, in response to changing the input signal from a high logic state to the zero logic state.

Figure 4:
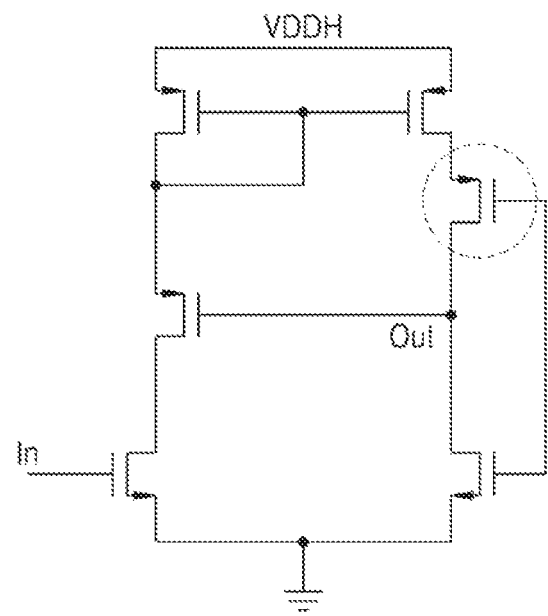
FIG. 4 illustrates a circuit arrangement of Wilson current mirror based level shifter with an arrangement to reduce a contention, according to the related art.

FIG. 4 illustrates a circuit arrangement of a modified Wilson current mirror based level shifter with an arrangement to reduce the contention, according to the related art. A P-type metal-oxide-semiconductor (PMOS) transistor of the modified Wilson current mirror based level shifter is shown in a dotted circle in FIG. 4. This transistor eliminates an occurrence of the contention between an input and output of the modified Wilson current mirror based level shifter during the high speed data transmission. However, the modified Wilson current mirror based level shifter with an arrangement to reduce the contention still has a disadvantage in that the PMOS transistor never goes into a completely off state, since a core domain signal is fed into the PMOS transistor.

Figure 5:
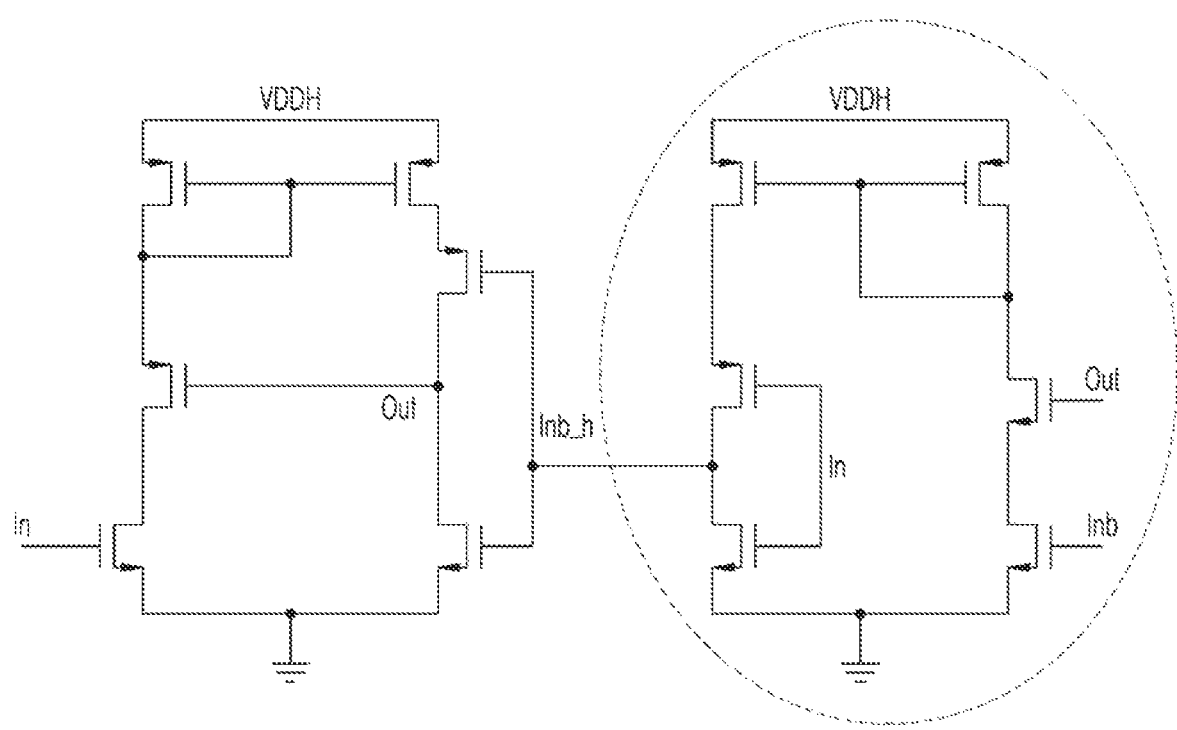
FIG. 5 illustrates a circuit arrangement of a Wilson current mirror based level shifter with an auxiliary level shifter, according to the related art.

FIG. 5 illustrates a circuit arrangement of a Wilson current mirror based level shifter with an auxiliary level shifter, according to the related art. The auxiliary level shifter shown inside the dotted circle generates Inb_h to completely turn off the PMOS transistor in FIG. 5 and eliminates the occurrence of the contention.

Thus, as discussed above many related art methods and circuit arrangements have been proposed for supporting high speed data transmission, but these related art circuit arrangements have disadvantages in terms of power consumption, robustness, reliability, integrity issues, operation dependency, time, cost, complexity, design, leakage current, hardware components used, size, converting the static data or Direct Current (DC) data while transmitting the data at the high speed or the like. Further, the related art level shifters add more jitter in the output signal and distort the output signal. Thus, it is advantageous to address the above mentioned shortcomings and disadvantages or at least provide a useful alternative.

Various embodiments disclosed herein provide a level shifter. The level shifter 100 may include a main level shifter portion 102 and an auxiliary level shifter portion 104, where the main level shifter portion 102 may be connected with the auxiliary level shifter portion 104. The main level shifter portion 102 may include a first set of PMOS transistors M3, M4, M5, M17, M20, M21 and a first set of NMOS transistors M1, M2, M6, M15, M16. Each transistor in the main level shifter portion 102 may include a source, a drain and a gate. The auxiliary level shifter portion 104 may include a second set of PMOS transistors M8, M9, M10, M13, M18, M19 and a second set of NMOS transistors M7, M11, M12, M14. Each transistor in the auxiliary level shifter portion 104 may include a source, a drain and a gate. The PMOS transistor M21 in the main level shifter portion 102 and/or the PMOS transistor M18 in the auxiliary level shifter portion 104 may be configured to support low frequency operation in the level shifter 100. The low frequency operation occurs when a pattern of the data includes either consecutive logic 1 (e.g. 7 consecutive logic 1) or consecutive logic 0 (e.g. 7 consecutive logic 0). A range of the low frequency operation refers to speeds equal to or lower than 800 MBPS.

In some embodiments, the level shifter 100 may convert a stream of binary values from a core supply voltage domain to an I/O voltage domain.

In some embodiments, at least one of the NMOS transistor M14 and the PMOS transistor M19 in the auxiliary level shifter portion 104 and the PMOS transistor M20 in the main level shifter portion 102 may control at least one of Inter Symbol Interference (ISI) and Data Dependent Jitter (DDJ) in the level shifter 100. That is, one or more of M14, M19 and M20 may control ISI or DDJ, or ISI and DDJ.

In some embodiments, in the main level shifter portion 102, the drain of the NMOS transistor M1 may be connected with the source of the NMOS transistor M2 and the drain of the NMOS transistor M2 may be connected with the drain of the PMOS transistor M3. The drain of the NMOS transistor M15 may be connected with the source of the NMOS transistor M16 and the drain of the NMOS transistor M16 may be connected with the drain of the PMOS transistor M17. The source of the PMOS transistors (M4, M3, M17, M20 and M21) may receive a power supply (i.e. 1.2V voltage domain), and the drain of the NMOS transistor M6 may be connected with the drain of the PMOS transistor M5 and the source of the PMOS transistor M5 may be connected with the drains of the PMOS transistors M4, M21. The gate of the PMOS transistor M3 may be connected with the gate of the PMOS transistor M4, the drains of the PMOS transistor M20 and the PMOS transistor M3.

In some embodiments, in the auxiliary level shifter portion 104, the drain of the NMOS transistor M7 may be connected with the drain of the PMOS transistor M8 and the source of the PMOS transistor M8 may be connected with the drain of the PMOS transistor M9 and the drain of the NMOS transistor M14. The drain of the NMOS transistor M12 may be connected with the source of the NMOS transistor M11, and the drain of the NMOS transistor M11 may be connected with the drain of the PMOS transistor M10. The drain of the PMOS transistor M13 may be connected with the drains of the NMOS transistor M11 and the PMOS transistor M10. The drains of the PMOS transistor M19 and the NMOS transistor M11 may be connected with the gates of the PMOS transistors M9, M10. The drain of the PMOS transistor M18 may be connected with the drains of the NMOS transistor M7 and the PMOS transistor M8. The sources of the PMOS transistors M9, M10, and M13 may be connected to the sources of the PMOS transistors M18, M19.

In some embodiments, in the main level shifter portion 102 and the auxiliary level shifter portion 104, the gates of the PMOS transistor M5 and the NMOS transistor M6 may be connected with the drains of the NMOS transistor M7 and the PMOS transistor M8. The gates of the PMOS transistors M21, M20, and M8 and the NMOS transistor M2 may be connected to the drains of the PMOS transistor M17 and the NMOS transistor M16. The sources of the NMOS transistors M15, M1, M6, M7, M12, and M14 may be grounded.

In some embodiments, at least one of the PMOS transistor M21 in the main level shifter portion 102 and the PMOS transistor M18 in the auxiliary level shifter portion 104 may be configured to support a low frequency operation in the level shifter 100. The normal operation of the level shifter includes, when input data received at the level shifter 100 toggles from 0 to 1, the NMOS transistor M1 is turned on, OUT_H is already 0 so IN_N_H_INT is 1, the NMOS transistor M2 is on, so that the NMOS transistors M1, M2 and the PMOS transistor M3 turn on and a voltage of a GATE node goes down, so the PMOS transistor M4 turns on, and the NMOS transistor M7 turns on and the NMOS transistor M7 pulls down OUT_B_H node to ground, the PMOS transistor M5 turns on and the NMOS transistor M6 turns off and the PMOS transistor M4 pulls the OUT_H up, as the OUT_H becomes high the IN_N_H_INT goes low and the NMOS transistor M2 is turned off and hence shutting down the path to the NMOS transistors M1, M2 and the PMOS transistor M3 so as to cut off the current path and reduce power consumption during the low frequency operation.

When input data received at the level shifter 100 toggles from 1 to 0, IN_N changes from 0 to 1 and the NMOS transistor M12 pulls IN_H down to 0, the PMOS transistor M10 and the NMOS transistors M11, M12 are turned on and pulls AUX_GATE signal low, the IN_N_H_INT is 0 and hence the PMOS transistor M8 is on and the NMOS transistor M7 is already turned off, so that the OUT_B_H is pulled high by the PMOS transistor M9, and since the OUT_B_H goes high, the OUT_H is pulled to 0 by the NMOS transistor M6.

In some embodiments, the level shifter 100 may support a high speed data pattern of 5 Giga bytes per second to 6 Giga bytes per second.

Unlike the related art systems described above, the level shifter 100 supports high speed data transmission (e.g., 5 Giga bytes per second to 6 Giga bytes per second) at a serial interface of an electronic device with a reduced power consumption. Further, the level shifter 100 supports low frequency operation and minimizes power consumption at the level shifter 100 during the low frequency operation. An Inter Symbol Interference (ISI) and Data Dependent Jitter (DDJ) that occurs at the level shifter during the high speed serial data transmission is significantly lower compared to ISI and DDJ of the related art systems. Therefore, the level shifter 100 converts a signal passing through a signal path of a serial data transmitter from a low voltage domain (e.g., 0.6V to 0.9 V) to a high voltage domain (e.g., 1V to 1.4 V) reliably without distorting the signal.

Unlike the related art systems described above, the level shifter 100 is connected in between a pre-driver and a driver of the serial data transmitter of the electronic device for matching a voltage domain of an output of the pre-driver to a voltage domain of an input of the driver. The conversion of the voltage domain is performed after the pre-driver, which reduces the power consumption at the pre-driver and also meets a swing requirement of the driver.

Related art level shifter architecture consists of a latch which is not useful to support the high speed data transmission. The latch may be replaced by a Differential to Single Ended (D2S) structure to support high speed data transmission. However during the low frequency operation, the related art level shifter draws a static current making the related art level shifter unusable for a level shifting application, since a data pattern may contain static data. To reduce the power consumption due to the static data, switches are introduced in the D2S structure, which causes contention in the related art level shifter. Further, the switches are driven by a level shifted signal generated by an auxiliary level shifter in order to remove the contention completely. In the auxiliary level shifter, level shifted signals are used to cut off paths to reduce the contention. Internal nodes of the related art level shifter settle to various values based on the data pattern of the high speed data transmission, resulting in occurrence of the DDJ.

By contrast, according to various embodiments, switches including the PMOS transistors M20, M19, M13 and the NMOS transistor M14 are included in the level shifter 100 to quickly settle the internal nodes to predetermined values for supporting high speed data transmission and reducing the DDJ as well as the ISI. Further, according to various embodiments, keeper switches including the PMOS transistors M21, M18 are included in the level shifter 100 to hold different nodes to intended values during the low frequency operation. According to various embodiments, the NMOS transistor M14 is controlled by an output of another level shifter which is taking an inverted version of the input for faster settling of the node to reduce the DDJ.

Figure 6A:
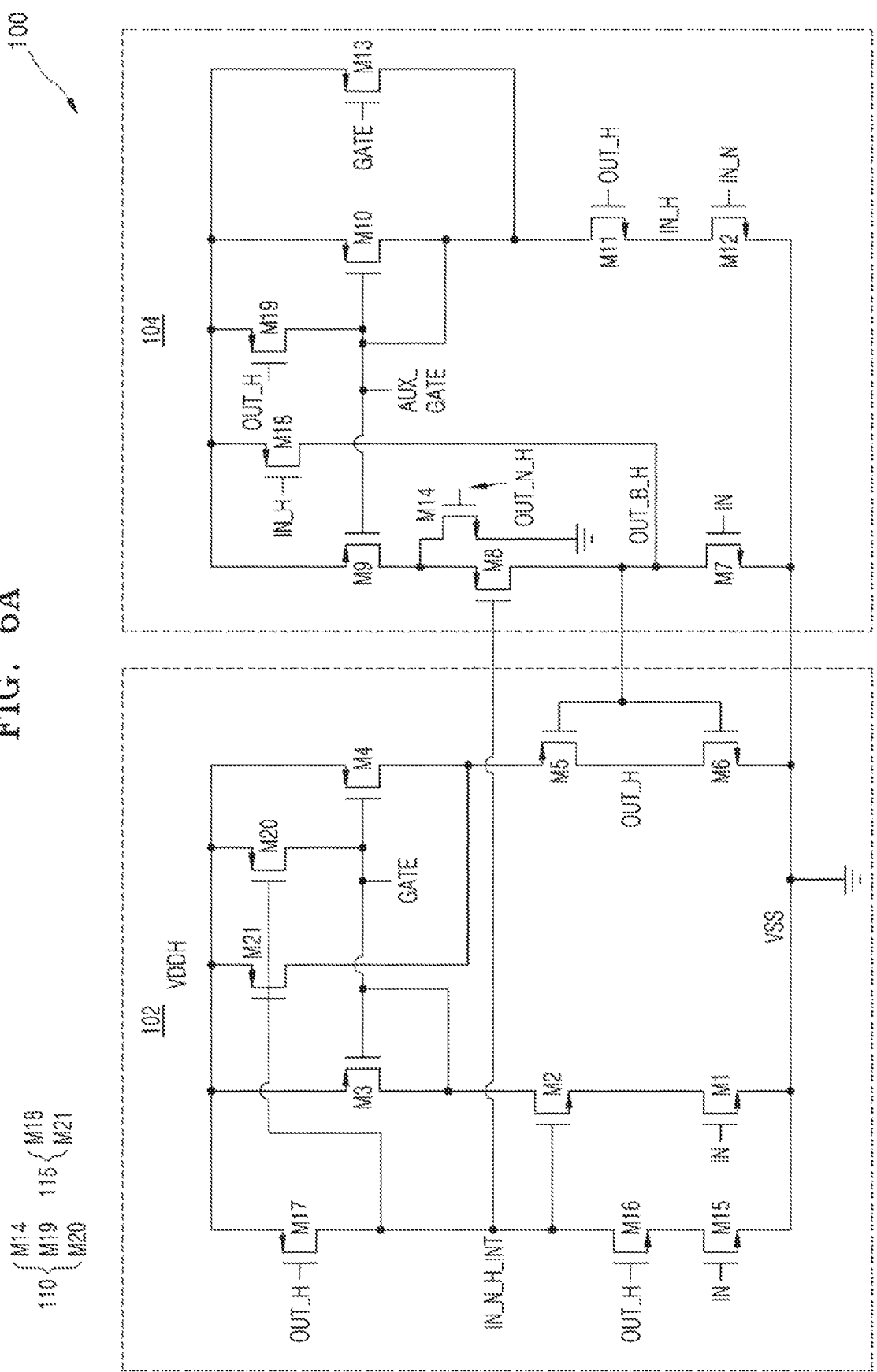
FIG. 6A illustrates a circuit arrangement of a level shifter that supports high speed data transmission according to an embodiment.

Referring now to the drawings, and more particularly to FIGS. 6A through 7, various embodiments will be described with reference to FIGS. 6A-7.

Figure 6B:
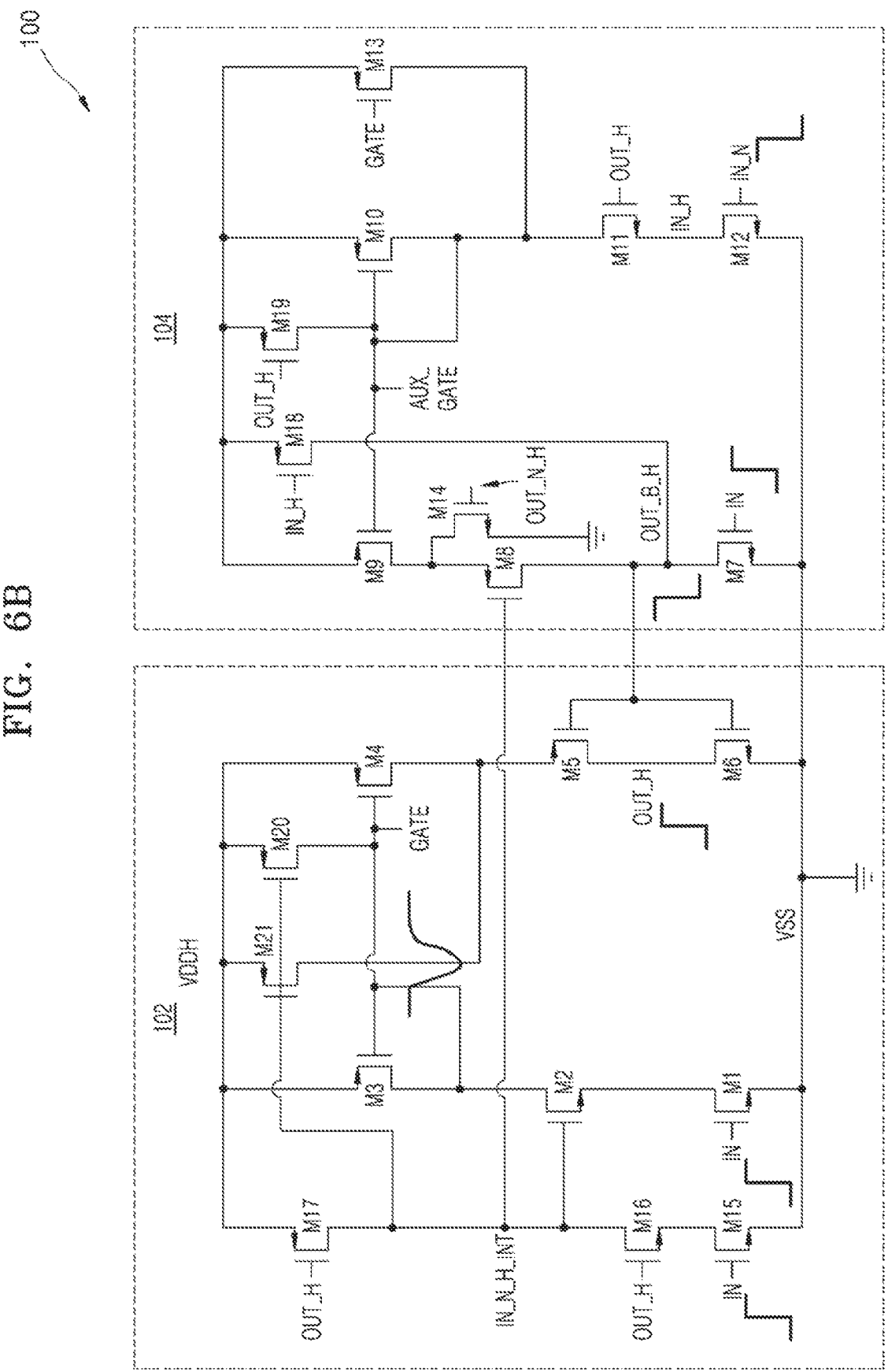
FIG. 6B illustrates the circuit arrangement and operations of the level shifter of FIG. 6A when input data received at the level shifter toggles from 0 to 1, according to an embodiment.
Figure 6C:
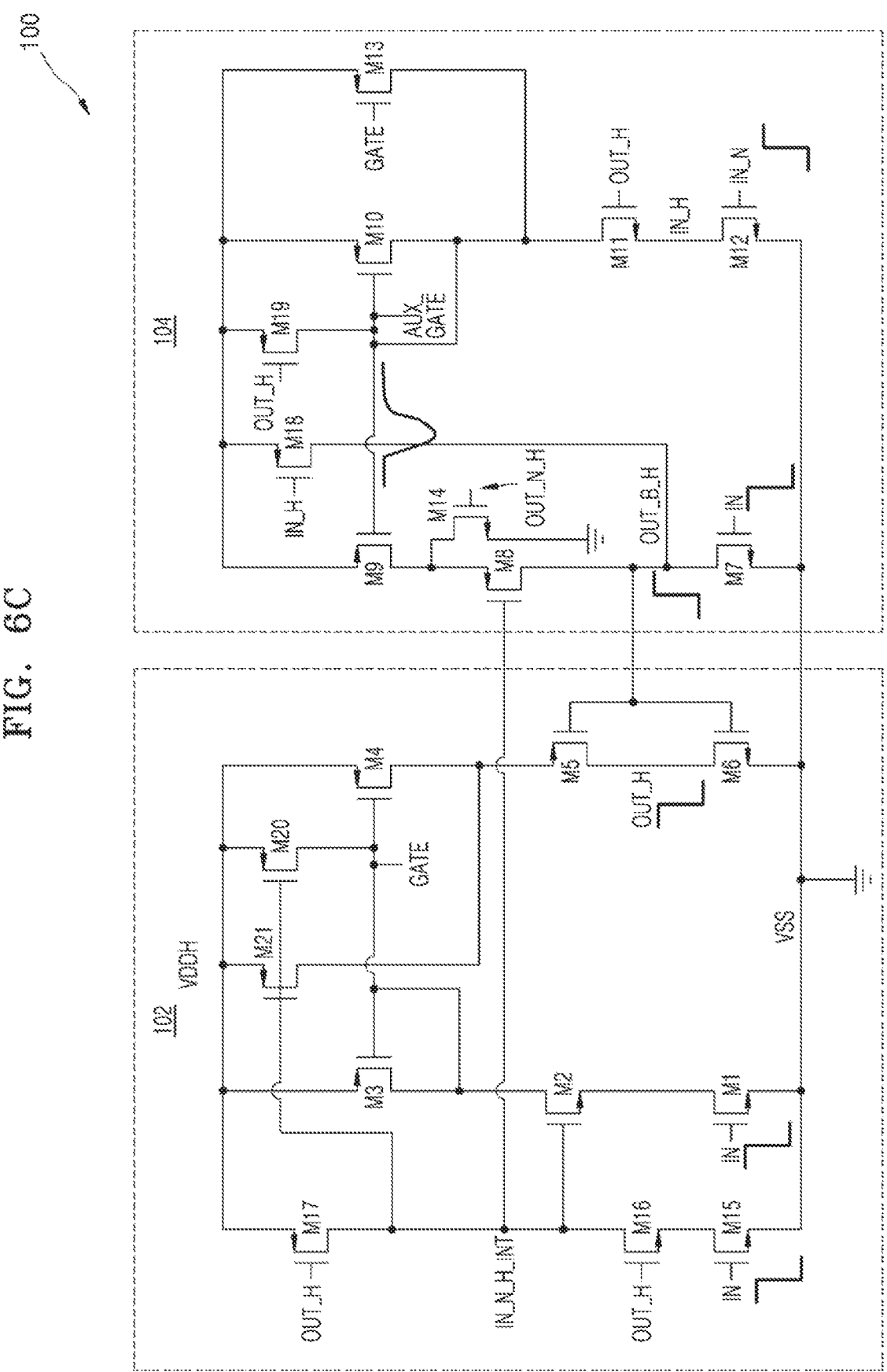
FIG. 6C illustrates the circuit arrangement and operations of the level shifter of FIG. 6A when input data received at the level shifter toggles from 1 to 0, according to an embodiment.

FIG. 6A illustrates a circuit arrangement of a level shifter that supports high speed data transmission according to an embodiment. FIG. 6B illustrates the circuit arrangement and operations of the level shifter of FIG. 6A when input data received at the level shifter toggles from 0 to 1, according to an embodiment. FIG. 6C illustrates the circuit arrangement and operations of the level shifter of FIG. 6A when input data received at the level shifter toggles from 1 to 0, according to an embodiment.

FIG. 6A illustrates a circuit arrangement of a level shifter that supports high speed data transmission, according to an embodiment. In some embodiments, the level shifter 100 may include a main level shifter portion 102 and an auxiliary level shifter portion 104. The main level shifter portion 102 may be connected with the auxiliary level shifter portion 104. In some embodiments, the main level shifter portion 102 may be a current mirror based level shifter. The main level shifter portion 102 may include a plurality of PMOS transistors and a plurality of NMOS transistors. The plurality of NMOS transistors in the main level shifter portion 102 may include a first NMOS transistor M1, a second NMOS transistor M2, a third NMOS transistor M6, a fourth NMOS transistor M15 and a fifth NMOS transistor M16. The plurality of PMOS transistors in the main level shifter portion 102 may include a first PMOS transistor M3, a second PMOS transistor M4, a third PMOS transistor M5, a fourth PMOS transistor M17, a fifth PMOS transistor M20, and a sixth PMOS transistor M21.

The auxiliary level shifter portion 104 may include a plurality of PMOS transistors M8, M9, M10, M13, M18, M19 and a plurality of NMOS transistors M7, M11, M12, M14. The plurality of NMOS transistors in the auxiliary level shifter portion 104 may include a sixth NMOS transistor M7, a seventh NMOS transistor M11, an eighth NMOS transistor M12, and a ninth NMOS transistor M14. The plurality of PMOS transistors in the auxiliary level shifter portion 104 may include a seventh PMOS transistor M8, an eighth PMOS transistor M9, a ninth PMOS transistor M10, a tenth PMOS transistor M13, an eleventh PMOS transistor M18, and a twelfth PMOS transistor M19. Each transistor in the main level shifter portion 102 and the auxiliary level shifter portion 104 includes a source, a drain and a gate.

The drain of the first NMOS transistor M1 is connected with the source of the second NMOS transistor M2. The drain of the second NMOS transistor M2 is connected with the drain of the first PMOS transistor M3. The drain of the fourth NMOS transistor M15 is connected with the source of the fifth NMOS transistor M16. The drain of the fifth NMOS transistor M16 is connected with the drain of the fourth PMOS transistor M17. The source of the first, second, fourth, fifth and sixth PMOS transistors M3, M4, M17, M20 and M21 are connected to and receive a power supply (e.g., VDDH). The drain of the third NMOS transistor M6 is connected with the drain of the third PMOS transistor M5. The source of the third PMOS transistor M5 is connected with the drains of the second and sixth PMOS transistors M4, M21. The gate of the first PMOS transistor M3 is connected with the gate of the second PMOS transistor M4 and the drains of the fifth PMOS transistor M20 and the first PMOS transistor M3.

Further, the drain of the sixth NMOS transistor M7 is connected with the drain of the seventh PMOS transistor M8. The source of the seventh PMOS transistor M8 is connected with the drain of the eighth PMOS transistor M9 and the drain of the ninth NMOS transistor M14. The drain of the eighth NMOS transistor M12 is connected with the source of the seventh NMOS transistor M11. The drain of the seventh NMOS transistor M11 is connected with the drain of the ninth PMOS transistor M10. The drain of the tenth PMOS transistor M13 is connected with the drains of the seventh NMOS transistor M11 and the ninth PMOS transistor M10. The drains of the twelfth PMOS transistor M19 and the seventh NMOS transistor M11 are connected with the gates of the eighth and ninth PMOS transistors M9 and M10. The drain of the eleventh PMOS transistor M18 is connected with the drains of the sixth NMOS transistor M7 and the seventh PMOS transistor M8. The sources of the eighth, ninth, and tenth PMOS transistors M9, M10, and M13 are connected to the sources of the eleventh and twelfth PMOS transistors M18, M19. In some embodiments, a node formed by connecting the gates of the first, second, and tenth PMOS transistors M3, M4, M13 and the drains of the first and fifth PMOS transistors (M3, M20) is a GATE node. In some embodiments, a node formed by connecting the gates of the eighth and ninth PMOS transistors M9, M10, the drains of the ninth, tenth and twelfth PMOS transistors M10, M13, M19 and the drain of the seventh NMOS transistor M11 is an AUX_GATE node.

Further, an input (IN) is provided to the gates of the first, sixth and seventh NMOS transistors M1, M7, and M15. In some embodiments, an input signal (i.e. input data) that is input to the level shifter 100 may be in a range of 0.5 V to 0.9 V, and may more particularly be, 0.5 V to 0.7 V. However, embodiments are not limited thereto and in other embodiments, the input signal may be in a different range. Further, the input (IN_N) is provided to the gate of the eighth NMOS transistor M12. Further, an input (IN_H) is provided to a gate of the eleventh PMOS transistor M18. The gates of the fifth, sixth and seventh PMOS transistors M20, M21, and M8 and the second NMOS transistor M2 are connected to the drains of the fourth PMOS transistor M17 and the fifth NMOS transistor M16. In some embodiments, a node formed by connecting the gates of the fifth, sixth and seventh PMOS transistors M20, M21, and M8 and the second NMOS transistor M2, and the drains of the fourth PMOS transistor M17 and the fifth NMOS transistor M16 is IN_N_H_INT, where a signal at the IN_N_H_INT is an inverted version of the input data IN_N and the input data IN_H that is level shifted internally. Further, the sources of the first, third, fourth sixth, eighth, and ninth NMOS transistors M1, M6, M15, M7, M12, M14 are grounded (i.e. VSS).

In some embodiments, a node formed by connecting the drains of the third NMOS transistor M6 and the third PMOS transistor M5, and the gates of the fifth and seventh NMOS transistors M16, M11 and the fourth and twelfth PMOS transistors M17, M19 is OUT_H, where the OUT_H is an output of the level shifter 100. In some embodiments, an output signal of the level shifter 100 is in a range of 1.0 V to 1.4 V. However, embodiments are not limited thereto and, in other embodiments, the output signal may be in a different range. The gates of the third PMOS transistor M5 and the third NMOS transistor M6 are connected with the drains of the sixth NMOS transistor M7 and the seventh PMOS transistor M8. In some embodiments, a node formed by connecting the gates of the third PMOS transistor M5 and the third NMOS transistor M6, and the drains of the sixth NMOS transistor M7 and the seventh and eleventh PMOS transistors M8, M18 is OUT_B_H, where a signal at the OUT_B_H is an inverted version of the output OUT_H of the level shifter 100 in an I/O voltage domain. In some embodiments, the gate of the ninth NMOS transistor M14 is OUT_N_H, where the OUT_N_H is an output of another similar level shifter 100A, where the level shifter 100A is not shown in FIG. 6A. The level shifter 100A may have a same structure as the level shifter 100 and therefor a repeated description thereof is omitted for conciseness. An input of the level shifter 100A is a complementary or inverted version of the input to the level shifter 100.

As described above, the main level shifter portion 102 may be a current mirror based level shifter and may include the auxiliary level shifter portion 104, and the level shifter 100 may further include a switch circuit 110 including the fifth, ninth and twelfth PMOS transistors M20, M14, and M19 to quickly settle the internal nodes to predetermined values for supporting high speed data transmission and reducing the DDJ as well as the ISI. In an embodiment, the fifth, the ninth and the twelfth PMOS transistors M20, M14, and M19 act as a switch. Further, according to various embodiments, the level shifter may further include a hold switch circuit 115 including the sixth and eleventh PMOS transistors M21, M18 to hold different nodes to intended values during the low frequency operation. Further, according to various embodiments, the level shifter 100 may include the ninth PMOS transistor M14 that is controlled by an output of another level shifter which is an inverted version of the input for faster settling of the node to reduce the DDJ.

A data path inside a data transmitter contains a differential signal, where the data is sent along with an inverted version of the data. The level shifter 100 converts the inverted version of the input data of a lower voltage domain to a higher voltage domain to settle the node of the drain of the PMOS transistors M9 transistor to ground for high frequency data.

In some embodiments, the level shifter 100 converts a stream of binary values from a core supply voltage domain to the I/O voltage domain. In some embodiments, a voltage range of the core supply voltage domain is 0.6 V to 0.9 V. In some embodiments, a voltage range of the I/O voltage domain is 1 V to 1.4 V.

In some embodiments, at least one of the ninth NMOS transistor M14 and the twelfth PMOS transistor M19 in the auxiliary level shifter portion 104 and the fifth PMOS transistor M20 in the main level shifter portion 102 controls at least one of Inter Symbol Interference (ISI) and Data Dependent Jitter (DDJ) in the level shifter 100. In related art level shifters, DDJ/ISI is caused due to not settling internal nodes properly, when the input signal is not provided. Moreover, in related art level shifters, the DDJ/ISI is caused due to unequal rise time and fall time of the input signal due to different nodes settling at different voltage after data transition of different width. Therefore, in the related art level shifters, a stuck condition occurs at the nodes at different voltages, in response to receiving the input signal with a high frequency data pattern (e.g. a Pseudo-Random Binary Sequence (PRBS)).

In contrast to the related art level shifters, in a level shifter according to various embodiments, the ninth NMOS transistor M14 and the fifth and twelfth PMOS transistors M20, M19 operate as switches for faster settling of the internal nodes to well defined values, e.g., a ground voltage or a supply voltage, during high frequency operation to reduce DDJ/ISI. Further, in a level shifter according to various embodiments, the ninth NMOS transistor M14 is controlled by an output of another level shifter (not shown) which is using an inverted version of the input signal for faster settling of the node to reduce the DDJ/ISI. In response to receiving an input signal with the high frequency data pattern at the level shifter 100, the internal nodes settle to a same value after every transition. Therefore, the rise time and the fall time of the output signal is fairly similar.

In some embodiments, the level shifter 100 supports a high speed data pattern at least 5 Giga bytes per second. In contrast to related art level shifters, in a level shifter according to various embodiments, the auxiliary level shifter portion 104 level shifts a signal at the OUT_B_H to the I/O voltage domain. Therefore, the third PMOS transistor M5 is totally turned off, which terminates an occurrence of a contention between the third NMOS transistor M6 and the sixth PMOS transistor M21. A power consumption of the level shifter 100 is low compared to the power consumption of related art level shifters, and a level shifter according to various embodiments may support high speed data transmission due to terminating the occurrence of the contention.

In some embodiments, at least one of the sixth PMOS transistor M21 in the main level shifter portion 102 and the eleventh PMOS transistor M18 in the auxiliary level shifter portion 104 is configured to support a low frequency operation in the level shifter 100. The low frequency operation at the level shifter 100 is explained with reference to FIGS. 6B-6C.

The level shifter 100 supports the high speed data transmission at a serial interface of an electronic device. Examples for the electronic device are, but not limited to a High Definition (HD) Television, HD monitors, HD projectors, routers, printers, and the like.

Although FIG. 6A shows hardware components of the level shifter 100, it is to be understood that other embodiments are not limited thereto. In other embodiments, the level shifter 100 may include less or more number of components. Further, the labels or names of the components are used only for illustrative purpose and does not limit the scope of the invention. One or more components can be combined together to perform same or substantially similar function for supporting the high speed data transmission.

FIG. 6B illustrates the circuit arrangement and operations of the level shifter 100 of FIG. 6A when input data received at the level shifter 100 toggles from 0 (i.e. logic state 0) to 1 (i.e. logic state 1), according to some embodiments.

In some embodiments, at least one of the sixth PMOS transistor M21 in the main level shifter portion 102 and the eleventh PMOS transistor M18 in the auxiliary level shifter portion 104 is configured to support the low frequency operation in the level shifter 100. For example, when the input data receives at the level shifter 100 toggles from 0 to 1, the first NMOS transistor M1 is turned on, OUT_H is already 0, so IN_N_H_INT is 1, hence the second NMOS transistor M2 is on. Therefore, the first and second NMOS transistors M1, M2 and the first PMOS transistor M3 turn on and a voltage of the GATE node goes down (i.e. logic state 0), and hence the second PMOS transistor M4 turns on. Then, the sixth NMOS transistor M7 turns on, which over powers the eleventh PMOS transistor M18, which is a weak pull up switch, to pull down the OUT_B_H node to ground (i.e. logic state 0). Further, the third PMOS transistor M5 turns on and the third NMOS transistor M6 turns off. Therefore, the second PMOS transistor M5 pulls the OUT_H up (i.e. logic state 1). As the OUT_H becomes high (i.e. logic state 1), IN_N_H_INT goes low (i.e. logic state 0) and the second NMOS transistor M2 is turned off, hence a current path to the first and second NMOS transistors M1, M2 and the first PMOS transistor M3 shuts down and reduces the power consumption during the low frequency operation. Further, the second PMOS transistor M4 turns off.

FIG. 6C illustrates the circuit arrangement and operations of the level shifter 100 of FIG. 6A, when input data received at the level shifter 100 toggles from 1 to 0, according to some embodiments. For example, when the input data received at the level shifter 100 toggles from 1 to 0, IN_N changes from 0 to 1, OUT_H is already high, and the eighth NMOS transistor M12 pulls the IN_H down to 0. The ninth PMOS transistor M10 and the seventh and eighth NMOS transistors M11, M12 are turned on and pull a voltage at the AUX_GATE to a low signal. IN_N_H_INT is 0 and hence the seventh PMOS transistor M8 is on and the sixth NMOS transistor M7 is already turned off. Therefore, OUT_B_H is pulled high by the eighth PMOS transistor M9. OUT_B_H goes high, which turns off the third PMOS transistor M5 and turns on the third NMOS transistor M6 which pulls the OUT_H to 0. Further, the seventh NMOS transistor M11 cuts off, the current path between the ninth PMOS transistor M10 and the seventh and eighth NMOS transistors M11, M12 shuts down and the voltage at the AUX_GATE comes back to an initial value between the eighth and ninth PMOS transistors M9, M10. As the eighth NMOS transistor M12 becomes high, IN_H goes to 0. In some embodiments, a size of the sixth NMOS transistor M7 may be larger than the eleventh PMOS transistor M18 due to a higher width to length ratio of the sixth NMOS transistor M7 with respect to the eleventh PMOS transistor M18. Therefore, the strength (e.g. power rating) of the sixth NMOS transistor M7 is more than the strength of the eleventh PMOS transistor M18.

The PMOS transistors M21 and M18 are used for the low frequency operation to make sure an output is held to a defined value. Here the low frequency operation means that the input data is not toggling i.e. the input data is either logical 0 or logical 1 for a long time. Now, when the input data toggles from logic 0 to logic 1 the output changes to logic 1 in the aforementioned procedure. Now once the output changes to logic 1, then all the current paths are shut to ensure no static current consumption. The OUT_H goes from logic 0 to logic 1 through the charging path of the PMOS transistors M4 and M5. But as soon as the OUT_H goes to logic 1, the IN_N_H_INT goes low. Hence, the gate node is pulled to Vddh (i.e. logic high). Hence, the charging path through the PMOS transistor M4 is shut. Further, the PMOS transistor M21 turns on and holds the source of M5 to Vddh (i.e. logic high) and that ensures the OUT_H node is held to logic 1. Similarly, when the input data is toggling from logic 1 to logic 0 the OUT_B_H is pulled to logic high through the PMOS transistors M9 and M8. Now as soon as the OUT_H goes low the IN_N_H_INT node is pulled to logic high. This shuts off the current path by turning off the PMOS transistor M8. Further, the PMOS transistor M18 turns on making sure the OUT_B_H node is held to logic high. So that OUT_H node is held at logic low. The twelfth PMOS transistor M19 is responsible for settling the AUX_GATE node to the Vddh.

FIG. 7 illustrates an input signal provided to the level shifter 100 and the output signal generated by the level shifter 100 based on the input signal, according to various embodiments. The input signal provided to the level shifter 100 includes a stream of the binary values in a core supply voltage domain (i.e. binary values varies within voltage range of 0.75 V and 0.98 V). The level shifter 100 converts the stream of the binary values from the core supply voltage domain to the I/O voltage domain. The output signal from the level shifter 100 includes the stream of the binary values in the I/O voltage domain (i.e. the binary values varies within voltage range 1.0 V to 1.4 V).

The foregoing description of various embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the various embodiments herein have been described in various terms, those skilled in the art will recognize that the embodiments herein can be practiced with modification within the scope of the embodiments as described herein, such modifications being included in the scope of the appended claims.

We claim:
1. A level shifter comprising:
   a main level shifter portion comprising a plurality of first PMOS transistors and a plurality of first NMOS transistors; and
   an auxiliary level shifter portion that is connected to an output of the main level shifter portion, the auxiliary level shifter portion comprising a plurality of second PMOS transistors and a plurality of second NMOS transistors,
   wherein a first transistor of the plurality of first PMOS transistors of the main level shifter portion or a first transistor of the plurality of second PMOS transistors of the auxiliary level shifter portion is configured to support a data transmission speed equal to or lower than 800 Megabytes per second, and
   wherein the main level shifter portion has a Differential to Single Ended (D2S) structure to support a high speed data transmission.

2. The level shifter as claimed in claim 1, wherein the main level shifter portion receives a serial stream of binary values from a core supply voltage domain, the level shifter converts the serial stream of binary values from a core supply voltage to an input/output (I/O) voltage which is higher than the core supply voltage, and the auxiliary level shifter portion outputs the serial stream of binary values to an input/output (I/O) voltage domain.

3. The level shifter as claimed in claim 2, wherein the core supply voltage is 0.5 v to 0.9 v, and the input/output (I/O) voltage is 1.0 v to 1.4 v.

4. The level shifter as claimed in claim 1, wherein a second transistor of the plurality of first PMOS transistors of the main level shifter portion, and at least one of a first transistor of the plurality of second NMOS transistors or a second transistor of the plurality of second PMOS transistors of the auxiliary level shifter portion control at least one of Inter Symbol Interference (ISI) and Data Dependent Jitter (DDJ) in the level shifter.

5. The level shifter as claimed in claim 1, wherein a second transistor of the plurality of first PMOS transistors of the main level shifter portion, and at least one of a first transistor of the plurality of second NMOS transistors or a second transistor of the plurality of second PMOS transistors of the auxiliary level shifter portion control at least one of Inter Symbol Interference (ISI) and Data Dependent Jitter (DDJ) in the level shifter.

6. The level shifter as claimed in claim 1, wherein the high speed data transmission is from 5 Giga bytes per second to 6 Giga bytes per second.

7. The level shifter as claimed in claim 6, wherein the level shifter comprises a switch circuit connected to the main level shifter portion and to the auxiliary level shifter portion, and
   wherein the switch circuit comprises a plurality of switches that are driven by a level shifted signal generated by the auxiliary level shifter portion to cut internal current paths to reduce a contention caused by the D2S structure.

8. The level shifter as claimed in claim 7, wherein the plurality of switches of the switch circuit settle first internal nodes of the level shifter to predetermined values to support the high speed data transmission and to reduce Inter Symbol Interference (ISI) and Data Dependent Jitter (DDJ).

9. The level shifter as claimed in claim 8, wherein the level shifter comprises a hold switch circuit to hold second internal nodes of the level shifter to predetermined values when the data transmission speed is equal to or lower than 800 Megabytes per second.

10. The level shifter as claimed in claim 1, wherein a second transistor of the plurality of second PMOS transistors of the auxiliary level shifter portion is driven by an output of another level shifter to reduce Data Dependent Jitter (DDJ).

11. A level shifter comprising:
    a current mirror level shifter comprising a plurality of NMOS transistors and a plurality of PMOS transistors;
    an auxiliary level shifter connected to the current mirror level shifter, the auxiliary level shifter comprising a plurality of NMOS transistors and a plurality of PMOS transistors, wherein the current mirror level shifter and the auxiliary level shifter include internal nodes; and
    a switch circuit that is configured to settle the internal nodes to predetermined values to support high speed data transmission.

12. The level shifter as claimed in claim 11, wherein the high speed data transmission is from 5 Giga bytes per second to 6 Giga bytes per second.

13. The level shifter as claimed in claim 11, further comprising a hold switch circuit that holds the internal nodes to a certain value during low frequency operation.

14. The level shifter as claimed in claim 13, wherein the low frequency operation is less than or equal to 800 Megabytes per second.

15. The level shifter as claimed in claim 11, wherein the current mirror level shifter receives a serial stream of binary values of a core supply voltage of 0.6 v to 0.9 v, the level shifter converts the serial stream of binary values from the core supply voltage to an input/output (I/O) voltage of 1.0 v to 1.4 v, and the auxiliary level shifter outputs the serial stream of binary values of the input/output (I/O) voltage.

16. The level shifter as claimed in claim 11, wherein the current mirror level shifter receives a serial stream of binary values from a core supply voltage domain, the level shifter converts the serial stream of binary values from a core supply voltage to an input/output (I/O) voltage which is higher than the core supply voltage, and the auxiliary level shifter portion outputs the serial stream of binary values to an input/output (I/O) voltage domain.

17. The level shifter as claimed in claim 16, wherein the core supply voltage is 0.5 v to 0.9 v, and the input/output (I/O) voltage is 1.0 v to 1.4 v.

18. A level shifter comprising:
    a main level shifter comprising a plurality of NMOS transistors and a plurality of PMOS transistors configured in a Differential to Single Ended (D2S) structure;
    an auxiliary level shifter connected to an output of the main level shifter, the auxiliary level shifter comprising a plurality of NMOS transistors and a plurality of PMOS transistors, wherein the main level shifter and the auxiliary level shifter include internal nodes;
    a switch circuit that is configured to settle first nodes of the internal nodes to predetermined values to support high speed data transmission; and
    a hold switch circuit that holds second nodes of the internal nodes to a certain value during low frequency operation,
    wherein the high speed data transmission is from 5 Giga bytes per second to 6 Giga bytes per second,
    the low frequency operation is less than or equal to 800 Megabytes per second, and
    the level shifter receives a serial stream of binary values of a core supply voltage of 0.6 v to 0.9 v, converts the serial stream of binary values from the core supply voltage to an input/output (I/O) voltage of 1.0 v to 1.4 v, and outputs the serial stream of binary values of the input/output (I/O) voltage.

\* \* \* \* \*